June 18, 1968 R. SCHIMMER 3,389,024
METHOD OF FORMING A SEMICONDUCTOR BY DIFFUSION THROUGH THE USE OF A COBALT SALT
Filed May 12, 1965
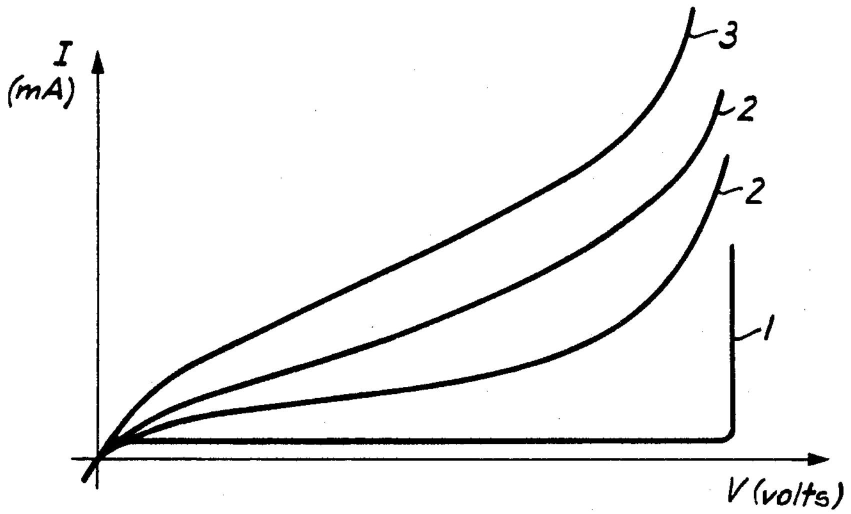
Inventor:
Rigobert Schimmer
By: Spencer & Kaye
Attorneys 3,389,024
Patented June 18, 1968

3,389,024

METHOD OF FORMING A SEMICONDUCTOR BY DIFFUSION THROUGH THE USE OF A COBALT SALT

Rigobert Schimmer, Belecke (Mohne), Germany, assignor to Licentia Patent-Verwaltungs-G.m.b.H., Frankfurt am Main, Germany Filed May 12, 1965, Ser. No. 455,156
Claims priority, application Germany, May 12, 1964, L 47,792
9 Claims. (Cl. 148—188)

ABSTRACT OF THE DISCLOSURE

A method of making semiconductor devices having "hard" characteristic curves so that there be little variation of the electrical properties between individual devices. The semiconductor devices are of the type having a monocrystalline silicon body with one or more pn-junctions formed in its surface by a diffusion, normally at a temperature of at least 1200° C., of a p- or n-type impurity into the surface. The method comprises the steps of treating the diffusion surface with a solution of a salt, e.g., cobalt nitrate or cobalt chloride; rinsing the surface, if necessary, and drying it; and diffusing a substance such as cobalt or sodium into the surface along with the impurity. The solution may include either a volatile organic solvent, such as methanol or isopropyl alcohol, or a water soluble silicon etching solvent, such as aqua regia.

The present invention relates to a method for the production of a semiconductor device including a semiconductor body formed of monocrystalline silicon, and particularly to such device in which at least one pn-junction is formed in the silicon body by diffusion of a p- or n-type impurity, and the diffusion is carried out at a high temperature, e.g., greater than 1200° C.

Conventionally, in the production of silicon semiconductor devices wherein a pn-junction is produced by diffusion of an impurity, the lifetime of the minority carriers (for instance in an n-doped crystal) may drop from 1000 microseconds before diffusion to between approximately 0.05 and 5 microseconds. Moreover, conventionally produced silicon semiconductor devices exhibit a substantial spread between hard and softly breaking characteristic curves.

It is therefore an object of the present invention to determine a method of making semiconductor junction devices which exhibit hard characteristic curves.

It is a further object of the present invention to provide a method of making semiconductor junction devices wherein the shape of the characteristic curves of a batch of such devices exhibits very little variation from one device to the next.

These objects as well as others are achieved according to the present invention wherein semiconductor devices having monocrystalline silicon semiconductor bodies in which at least one pn-junction is formed by diffusion are produced by diffusing cobalt or sodium into the semiconductor body along with the junction-forming impurity. This method is especially advantageous for processes carried out at diffusion temperatures of over 1200° C.

Additional objects and advantages of the present invention will become apparent upon consideration of the following description when taken in conjunction with the accompanying drawings in which a plot is shown of several curves representing the voltage-current characteristics of various semiconductor junctions.

In the production of a large number of silicon semiconductor devices having diffused pn-junctions, the junction characteristics will exhibit a substantial spread in degree of "hardness" of the curve. This is illustrated schematically in FIGURE 1 in which the inverse voltage is plotted on the horizontal axis and the current is plotted on the vertical axis. The low range on the current axis is expanded relative to the higher range. The characteristic curves 2 exhibit varying degrees of softness and are scattered between the hard characteristic 1 and the very soft characteristic 3. The hard characteristic 1 shows a practically constant reverse current of about 1 ma. from a very low inverse voltage up to the breakdown voltage, the value of which depends on the material used. Above the breakdown voltage, the reverse current rises nearly vertically, and is nearly independent of the breakdown voltage.

On the other hand, the soft characteristics 2 and 3 show a gradual increase in reverse current from a low inverse voltage. For a junction such as is illustrated by the very soft characteristic 3, the current reaches a value of about 200 ma., for an inverse voltage of only about 800 v. The method provided by the present invention, on the other hand, results in uniformly hard characteristics, as shown in curve 1.

In addition, the method of the invention provides the advantage that at diffusion temperatures above 1200° C., occurring during diffusion to produce the pn-junction, little reduction in the life-time of the minority carriers occurs, as would otherwise be the case.

Thus, in a silicon crystal originally having a minority carrier lifetime of about 1000 microseconds, where cobalt is diffused in along with the junction-forming impurity, the minority carrier lifetime after diffusion will lie in a range up to about 100 microseconds, a relatively high value, depending on the particular conditions of the process. Where sodium is diffused in along with the impurity, the post-diffusion lifetime will always be at least greater than 0.5 microsecond.

A further advantage derived from the method of the invention lies in the resistance of junctions produced thereby to degradations of their characteristics caused by the subsequent alloying of a gold contact to the units. Normally, the relatively high alloying temperatures used for alloying such contacts, which contain at least some gold, further degrade the junction characteristics. When a junction has been treated according to the present invention, however, it is substantially insensitive to the effects of such contacting processes, contrary to the irregular and unpredictable behavior of units which have undergone the conventional oxide or halogen treatment after diffusion.

The silicon crystal forming the body of the semiconductor device may be treated in any one of a number of ways prior to diffusion to provide it with the desired cobalt or sodium. According to one embodiment of the invention, a solution of a cobalt salt or a sodium salt dissolved in relatively volatile organic solvent may be applied to that surface of the silicon body through which diffusion is to take place, after which the surface is dried. Subsequently, the silicon body is heated along with the impurity material to be diffused into it.

According to another embodiment of the invention, the surface of the silicon body through which diffusion is to take place may be etched down until the body has the desired thickness using a water-diluted etch solution to which a cobalt or sodium salt has been added. The etched surface is then rinsed with distilled water and dried, after which the boy is heated along with the impruity material to form the junction.

Instead of using the etching solution to reduce the thickness of the silicon body all the way down to the desired thickness before diffusion, an etching solution may be used which has only a slight effect on the silicon, but which will still deposit the desired cobalt or sodium atoms on the surface of the body.

According to another embodiment of the invention, cobalt or sodium may be applied to that surface of the silicon body through which the impurity is to be diffused by means of evaporation or electrophoresis, prior to diffusing the regular impurity material into the body.

These embodiments of the invention make possible the production of silicon junction devices in which the minority carrier lifetime, after diffusion, is confined to a range of only one or two orders of magnitude. The lifetime of the minority carriers may be varied by varying the concentration of cobalt in the cobalt solution. A longer minority carrier lifetime will be obtained for greater concentrations of cobalt in the solution. The effect of the cobalt on lifetime is also a function of the roughness of the silicon crystal surface upon which the cobalt solution is to be applied. The rougher the surface, the higher will be the resultant lifetime for any given cobalt concentration. Thus, high minority carrier lifetime may be obtained by applying a cobalt solution with a high cobalt concentration to a roughened surface of the silicon crystal. The lifetime so produced is also dependent on the manner in which the cobalt salt is applied to the silicon crystal surface. As outlined previously, the silicon crystal surface may first be etched away so that the body achieves a desired thickness, by means of an etching solution containing cobalt salt. Subsequently, the surface so etched may be rinsed with distilled water and dried, after which a solution of cobalt salt in a volatile organic solvent is applied and the surface is dried. Several applications of cobalt salt in an organic solvent may be provided, the surface being dried in between applications. Moreover, each of the rinses may be carried out either with distilled water or with distilled water containing a cobalt or sodium salt, or with a water soluble organic solvent, such as ethanol, in which a cobalt or sodium salt is dissolved. After the above-described procedure, the desired junction impurity is diffused into the silicon crystal.

As outlined above, according to one embodiment of the invention, a solution of cobalt or sodium salt in a volatile organic solvent may be applied to the surface of the silicon crystal through which diffusion is to take place and then such surface may be dried. Afterwards, the silicon body is heat treated along with the impurity material to diffuse the latter into the body to form the desired junction. In order to coat the desired surface of the silicon body with a solution of cobalt or sodium salt, the silicon body may be plunged into a solution containing the desired salt. Upon removal from the solution, a small amount of the solution sticks to the surface of the body, and after it is dried, a coating which contains the dissolved salt, which coating is invisible to the naked eye, remains on the silicon surface. Alternatively, the cobalt or sodium salt solution may be sprayed onto the surface of a silicon body.

If one proceeds according to the embodiment wherein the surface of the silicon body is treated with a water-diluted etch solution which only slightly affects silicon, the surface treated is rinsed with distilled water and dried before the desired impurity is diffused into it. In order to expose the body to the etch solution, in this case, the body may be suspended in the etch solution, which has been brought to a boil, for about ten minutes. Such solution may be aqua regia, for example. In this embodiment of the invention, a sufficient amount of cobalt or cobalt salt or sodium or sodium salt is adsorbed on the surface of the silicon body so that it can be seen by the naked eye. Before being treated with the water-soluble etch solution which only slightly affects silicon, the silicon body may be reduced from its original thickness to the thickness desired by means of an etching solution containing cobalt salt or sodium salt, or by an etching solution without such salt added. If an etch solution containing cobalt salt or sodium salt is used and the surface is then rinsed with distilled water, a layer of cobalt or sodium will be adsorbed onto the silicon crystal, but the layer will not be visible to the naked eye.

Insofar as cobalt and sodium salts for use with the method of the invention are concerned, cobalt nitrate and cobalt chloride are examples of cobalt salts which may be used, and sodium sulfate and sodium chloride are examples of sodium salts. If these substances are to be applied in a solution of relatively volatile organic solvent one may use, for instance, 50 mg. cobalt nitrate dissolved in 200 ml. methanol, or isopropyl alcohol, or a solution of 10 mg. sodium chloride dissolved in 200 ml. methanol.

For treating the silicon surface with a water-soluble etch which only slightly affects silicon, a solution of either 50 mg. cobalt nitrate or 50 mg. sodium chloride in 100 cc. aqua regia may be used.

According to a further feature of the invention, gallium, as well as cobalt, may be diffused into an n-conductive silicon body in a single diffusion step. In various conventional diffusion processes, when gallium is diffused into a silicon body, the junction characteristics of the resulting units exhibit a scattering towards soft characteristics, and/or a decrease in the minority carrier lifetime to unacceptably low values. This does not occur when the gallium is diffused into the body along with cobalt or sodium.

The method provided by the present invention, as described above, makes it possible to produce improved devices such as controlled silicon rectifiers, or thyristors. Such units have five semiconductor layers, two of which form contacts for providing a controlled circuit path, and to one of which control signals are supplied. In such devices, a hard control characteristic as well as a highly predictable and uniform value of breakdown voltage are very important. It is therefore especially advantageous to form the junction of such devices by the method of the present invention.

The following are specific examples of processes carried out according to the present invention:

(I) Before diffusing a desired impurity into a silicon crystal body to form a junction, the silicon body, having the desired dimensions, is painted on that surface through which diffusion is to take place, with a solution of cobalt nitrate in methanol, in the proportion of about 50 mg. cobalt nitrate to 200 ml. methanol. The surface is then dried by holding it in the vicinity of a heat lamp.

(II) Prior to diffusing an impurity into a silicon crystal body to form a junction therein, the surface of the silicon body through which diffusion is to take place is etched away by an aqueous etching solution containing cobalt chloride until the silicon body attains the desired thickness. The etched surface is then rinsed with distilled water and dried by bringing it near a heat lamp.

(III) Prior to diffusing an impurity into a silicon body, having the desired thickness, to form a pn-junction, the body is immersed for about 10 minutes in a solution of boiling aqua regia in which cobalt nitrate has been dissolved in a proportion of about 50 mg. cobalt nitrate to 100 cc. aqua regia. The body is then removed and rinsed in distilled water, after which it is dried by holding it in the vicinity of a heat lamp.

(IV) Before diffusing a desired impurity into a silicon crystal body to form a junction, the silicon body, having the desired dimensions, is painted on that surface through which diffusion is to take place, with a solution of sodium chloride in methanol, in the proportion of about 10 mg. sodium chloride to 200 ml. methanol. The surface is then dried by holding it in the vicinity of a heat lamp.

It will be understood that the above description of the present invention is susceptible to various modifications, changes and adaptations, and the same are intended to be comprehended within the meaning and range of equivalents of the appended claims.

What is claimed is:

1. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) applying to that surface of said silicon body through which said diffusion is to take place a solution of cobalt nitrate dissolved in a volatile organic solvent;
(b) drying said surface; and
(c) diffusing cobalt into said surface along with said impurity.

2. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) etching away that surface of said silicon body through which said diffusion is to take place until said body has a predetermined thickness, by means of a water-dissolved etching solution containing cobalt nitrate;
(b) rinsing said surface with distilled water;
(c) drying said surface; and
(d) diffusing cobalt into said surface along with said impurity.

3. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) treating that surface of said silicon body through which said diffusion is to take place with a water-soluble etching solution having at most a very slight effect on silicon, said etching solution containing cobalt nitrate;
(b) rinsing said surface with distilled water;
(c) drying said surface; and
(d) diffusing cobalt into said surface along with said impurity.

4. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) applying to that surface of said silicon body through which said diffusion is to take place a solution of cobalt chloride dissolved in a volatile organic solvent;
(b) drying said surface; and
(c) diffusing cobalt into said surface along with said impurity.

5. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) etching away that surface of said silicon body through which said diffusion is to take place until said body has a predetermined thickness, by means of a water-dissolved etching solution containing cobalt chloride;
(b) rinsing said surface with distilled water;
(c) drying said surface; and
(d) diffusing cobalt into said surface along with said impurity.

6. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) treating that surface of said silicon body through which said diffusion is to take place with a water-soluble etching solution having at most a very slight effect on silicon, said etching solution containing cobalt chloride;
(b) rinsing said surface with distilled water;
(c) drying said surface; and
(d) diffusing cobalt into said surface along with said impurity.

7. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) applying to that surface of said silicon body through which said diffusion is to take place a solution of cobalt nitrate in methanol in the proportion of about 50 mg. cobalt nitrate to 200 ml. methanol;
(b) drying said surface; and
(c) diffusing cobalt into said surface along with said impurity.

8. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) applying to that surface of said silicon body through which said diffusion is to take place a solution of cobalt nitrate in isopropyl alcohol in the proportion of about 50 mg. cobalt nitrate to 200 ml. isopropyl alcohol;
(b) drying said surface; and
(c) diffusing cobalt into said surface along with said impurity.

9. In a method of making a semiconductor device having a monocrystalline silicon body in which at least one pn-junction is formed by diffusion therein of a p- or n-type impurity, said diffusion normally occurring at a temperature of at least 1200° C., the steps of:

(a) treating that surface of said silicon body through which said diffusion is to take place with an etching solution of cobalt nitrate in aqua regia in the proportion of about 50 mg. cobalt nitrate to 100 cc. aqua regia;
(b) rinsing said surface with distilled water;
(c) drying said surface; and
(d) diffusing cobalt into said surface along with said impurity.

References Cited

UNITED STATES PATENTS

| | | | |
|---|---|---|---|
| 2,964,689 | 12/1960 | Buschert | 148—188 |
| 3,154,450 | 10/1964 | Hoeckelman | 148—190 X |
| 3,328,210 | 6/1967 | McCaldin | 148—187 X |
| 3,249,831 | 5/1966 | New | 148—190 X |

OTHER REFERENCES

"Semiconductors," by R. A. Smith Cambridge University Press 1959 p. 366.

HYLAND BIZOT, *Primary Examiner.*